Figure 1:
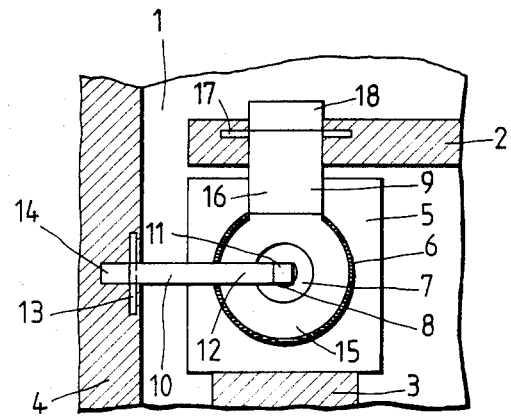

United States Patent [19]

Neidig et al.

[11] Patent Number: 4,502,750

[45] Date of Patent: Mar. 5, 1985

[54] ELECTRICAL CONNECTING STRAP FOR SEMICONDUCTOR COMPONENTS

[75] Inventors: Arno Neidig, Plankstadt; Altan Akyürek, Heppenheim; Hubert Hettmann, Hockenheim, all of Fed. Rep. of Germany

[73] Assignee: Brown, Boveri & Cie AG, Mannheim, Fed. Rep. of Germany

[21] Appl. No.: 396,652

[22] Filed: Jul. 9, 1982

[30] Foreign Application Priority Data

Jul. 11, 1981 [DE] Fed. Rep. of Germany ....... 3127458

[51] Int. Cl.³ .............................................. H01R 4/02
[52] U.S. Cl. .................................................. 339/275 R
[58] Field of Search ........... 339/275 R, 275 A, 275 C, 339/275 T; 29/843; 228/179, 180 A; 174/73.5 C, 73 R, 89

[56] References Cited

U.S. PATENT DOCUMENTS

| 4,023,008 | 5/1977 | Purussel | 339/275 R X |
| 4,054,238 | 10/1977 | Lloyd et al. | 228/180 A |
| 4,151,544 | 4/1979 | Riff | 339/275 R |
| 4,246,467 | 1/1981 | Boaz | 339/275 R X |

FOREIGN PATENT DOCUMENTS 950068 10/1956 Fed. Rep. of Germany ... 339/275 R

Primary Examiner—William R. Briggs
Attorney, Agent, or Firm—Herbert L. Lerner; Laurence A. Greenberg

[57] ABSTRACT

Connecting strap for electrically connecting a contact of a semiconductor component to a conductor run, including a bracket having two doubly bent ends, soldering lugs integral with the ends of the bracket, and lateral wings integral with one of the doubly bent ends of the bracket for connection to a conductor run.

10 Claims, 7 Drawing Figures

ELECTRICAL CONNECTING STRAP FOR SEMICONDUCTOR COMPONENTS

The invention relates to a connecting strap for a semiconductor component, for electrically connecting a main or control contact of the semiconductor component to a conductor run, wherein the connecting strap is in the form of a bracket with soldering tabs or lugs or soldering eyes or rings angled-off at both ends.

Such a connecting strap is known, for instance, from a brochure of the firm Teccor Electronics Inc., entitled "Technical Data T-1064", and serves the purpose of connecting the cathode (as a cathode strap) and the gate (as a gate strap) of a thyristor pellet to the ceramic substrate. The connecting strap can be soldered to the semiconductor pellet and to the conductor run while adding flux to reduce oxides present on the surfaces to be soldered. However, soldering at elevated temperatures (about 350° C.) with flux, and the cleaning operations subsequently necessary, are often not compatible with the passivation of active parts or other sensitive components on the ceramic substrate. A further disadvantage of large-area flux soldering is the possible occlusion of voids, i.e., of faults which are not soldered. This leads to undesirably high thermal resistances.

As an alternative to flux soldering, soldering may be performed in a continuous oven in a protective gas atmosphere. For this purpose, however, an accurate adjustment of the connecting strap and the semiconductor pellet by means of a soldering fixture is necessary. A disadvantage of the known connecting strap is that it is not possible to fix the connecting strap during its travel through the oven, and thus defective solder joints occur which may, for instance, cause a short circuit between the cathode and the gate of the semiconductor component.

Starting from this state of the art, it is accordingly an object of the invention to provide an electrical connecting strap for semiconductor components to electrically connect a contact of the semiconductor component to a conductor run, which overcomes the hereinafore-mentioned disadvantages of the heretofore-known devices of this general type, and which permits an accurate adjustment between the connecting strap and the semiconductor component in a soldering fixture.

With the foregoing and other objectives in view there is provided, in accordabce with the invention, a connecting strap for electrically connecting a contact of a semiconductor component run, comprising a bracket having two doubly bent ends, soldering lugs integral with the ends of the bracket, and lateral wings integral with one of the doubly bent ends of the bracket for connecting to a conductor run.

In accordance with another feature of the invention, the soldering lugs are ring-shaped.

In accordance with a further feature of the invention, the bracket is long and narrow for connection to the gate contact of a semiconductor component. In accordance with an added feature of the invention, the bracket is short and wide for connection to the cathode contact of a semiconductor component.

In accordance with an additional feature of the invention, the bracket lugs and wings are formed of a material from the group consisting of copper, brass, nickel alloys, nickel and bronze.

In accordance with again another feature of the invention, at least the wings and the soldering lugs have a side to be soldered, and including a solder coating disposed on the sides.

In accordance with again a further feature of the invention, there is provided a solderable layer, coating at least the wings and the soldering lugs.

In accordance with a concomitant feature of the invention, the solderable layer is in the form of a chemically or an electrically applied nickel layer.

The advantages attainable with the invention are in particular that through the construction of the connecting straps with side wings, an accurate adjustment of the straps relative to the corresponding semiconductor pellet becomes possible, with small tolerances. This effectively prevents gate/cathode short circuits. Due to the construction of the side wings, simple charging and discharging of the soldering fixture becomes possible, without the need for additional devices. Other features which are considered as characteristic for the invention are set forth in the appended claims.

Although the invention is illustrated and described herein as embodied in an electrical connecting strap for semiconductor components, it is nevertheless not intended to be limited to the details shown, since various modifications and structural changes may be made therein without departing from the spirit of the invention and within the scope and range of equivalents of the claims.

Figure 2A:
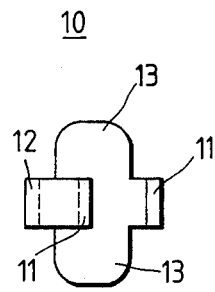
Figure 3A:
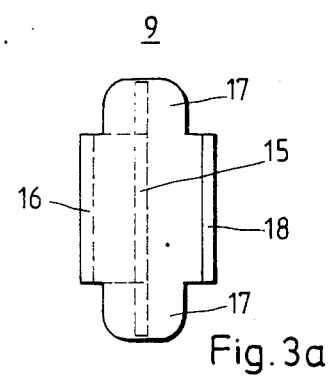

The construction and method of operation of the invention, however, together with additional objects and advantages thereof will be best understood from the following description of specific embodiments when read in connection with the accompanying drawings, in which:

FIG. 1 is a fragmentary, diagrammatic, cross-sectional view of a semiconductor component with connecting straps;

FIGS. 2a, b and c are enlarged top plan, side and front elevational views of a connecting strap for the gate contact; and FIGS. 3a, b and c are front and side elevational and top plan views of a connecting strap for the cathode contact.

Referring now to the figures of the drawing and first particularly to FIG. 1 thereof, there is seen a semiconductor component with connecting straps. Copper foils 2, 3 and 4 are applied as conductor runs to a ceramic plate 1 by a method described in U.S. patent application Ser. No. 286,453, filed July 24, 1981. The copper foil 2 serves in this case as the cathode lead, the copper foil 3 serves as the anode lead and the copper foil 4 is the gate lead for a semiconductor pellet or tablet 5 (which is the active semiconductor part), such as a thyristor. The anode of the semiconductor pellet 5 is soldered to the copper foil 3. On the side opposite the anode, the semiconductor pellet has an outer annular cathode contact 6 and an inner circular contact 8 (central gate). An insulating ring 7 is disposed between the cathode contact 6 and the gate contact 8.

The cathode contact 6 of the semiconductor pellet 5 and the copper foil 2 are electrically connected to each other by a connecting strap 9 (cathode strap 9); the strap 9 being soldered at one end thereof to the copper foil 2 and at its other end to the cathode contact 6. The gate contact 8 of the semiconductor pellet 5 and the copper foil 4 are electrically connected to each other by a connecting strap 10 (gate strap); the strap 10 being soldered at one end thereof to the copper foil 4 and at the other end thereof to the gate contact 8.

Figures 2B, 2C:
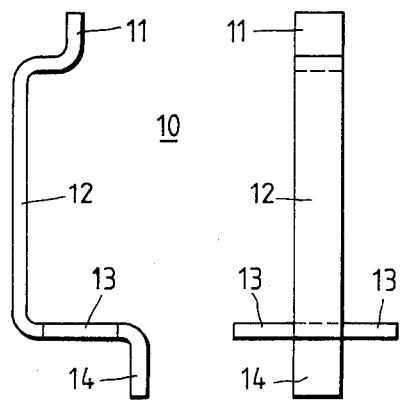

In FIGS. 2a, b and c, a connecting strap 10 for the gate contact 8 is shown. As shown in the side view of the gate strap 10 in FIG. 2b, the gate strap 10 has a soldering lug 11 for soldering to the gate contact 8 of the semiconductor pellet 5. The dimensions of the soldering lug 11 corresponds to the diameter of the gate contact 8. The soldering lug 11 is followed after a double angle or bend by a harrow long bracket 12. The bracket 12 merges after another double angle offset into a soldering lug 14 for soldering the strap 10 to the copper foil 4. Between the first and the second angle of the bracket 12 toward the soldering lug 14, the brackket 12 has two side wings 13. These two side wings 13 provide a defined position of the gate strap 10 during soldering in a soldering fixture; i.e., the soldering lug 11 is brought exactly over the gate contact 8 of the semiconductor pellet 5 for soldering. The side wings 13 prevent the soldering lug 11 from sliding laterally. FIG. 2a shows a view from above onto the gate strap 10, which permits a particularly good view of the embodiment of the two wide wings 13. FIG. 2c shows a front view of the gate strap 10, from which a particularly good view of the embodiment of the narrow bracket 12 and the two formed-on or integral side wings 13 can be obtained.

Figure 3B:
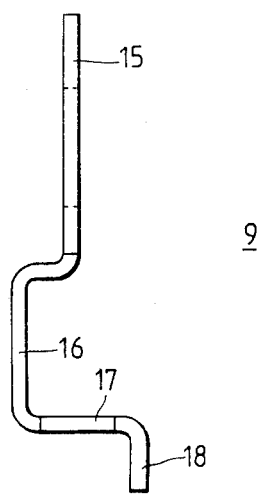

In FIGS. 3a, b and c, a connecting strap 9 for the cathode contact 6 is shown. FIG. 3b shows a side view of the cathode strap 9. The cathode strap 9 has a soldering eye or ring 15 for soldering to the annular cathode contact 6 of the semiconductor pellet 5. The inside diameter of the soldering ring 15 corresponds approximately to the outside diameter of the insulating ring 7, and the outside diameter of the soldering ring 15 corresponds approximately to the outside diameter of the cathode contact 6. The soldering ring 15 is followed after a double angle or bend by a short, wide bracket 16. The bracket 16 merges after another double angle or bend into a soldering lug 18 for soldering the cathode strap 9 to the copper foil 2. Between the first and second angle of the bracket 16 toward the soldering lug 18, the bracket 16 has two side wings 17. The two side wings 17 provide a defined position of the cathode strap 9 during soldering in a soldering fixture, i.e., the soldering ring 15 is brought over the cathode contact 6 of the semiconductor pellet 5 for soldering. The two side wings 17 prevent the soldering ring 15 from sliding laterally.

FIG. 3a shows a front view of the cathode strap 9, from which the construction of the two side wings 17 can be seen in particular.

Figure 3C:
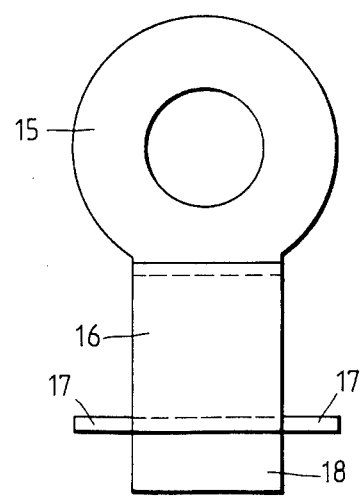

FIG. 3c shows a view from above onto the cathode strap 9, which allows a particularly good view of the construction of the soldering ring 15, of the short, wide bracket 16 and of the two side wings 17 formed thereon or integral therewith.

For soldering the cathode contact 6 and the gate contact 8 of the semiconductor pellet 5 to the cathode strap 9 and the gate strap 10, the connecting straps 9 and 10 as well as the semiconductor pellet 5 are placed in a suitably constructed soldering fixture. The solder joints between the copper foil 2 and the strap 9 and between the cathode contact 6 and the strap 9, as well as between the copper foil 4 and the strap 10 and between the gate contact 8 and the strap 10, can be made simultaneously during one soldering operation in a continuous oven and in a protective gas atmosphere. The soldering fixture is advantageously constructed in the form of a reusable continuous-run fixture and has openings corresponding to the side wings 13 and 17.

The electrical connecting straps 9 and 10 are formed of copper, nickel, nickel alloys or bronze, and are solder-coated on one side. Alternatively, the straps are nickel-plated, and interposed solder platelets are used for soldering the parts. The brackes 12, 16 are constructed while taking the expected current load and especially the current surge load into consideration. The doule angling-off or bending of the brackets 12 and 16 at both ends serves the purpose of breaking down mechanical stresses that may occur during the operation of the semiconductor component.

The foregoing is a description corresponding to German Application No. P 31 27 458.7, dated July 11, 1981, the International priority of which is being claimed for the instant application, and which is hereby made part of this application. Any discrepancies between the foregoing specification and the aforementioned corresponding German application are to be resolved in favor of the latter.

We claim:

1. Connecting strap for electrically connecting a contact of a semiconductor component to a conductor run, comprising a bracket having two sides and two doubly bent ends, soldering lugs integral with said ends of said bracket, and lateral wings integral with one of said doubly bent ends of said bracket, said lateral wings being spaced from the conductor run and said lateral wings being extended transversely from said two sides of said bracket for positioning the connecting strap for connection to a conductor run.

2. Connecting strap according to claim 1, wherein said soldering lugs are ring-shaped.

3. Connecting strap according to claim 1, wherein said bracket is long and narrow for connection to the gate contact of a semiconductor component.

4. Connecting strap according to claim 1 or 2, wherein said bracket is short and wide for connection to the cathode contact of a semiconductor component.

5. Connecting strap according to claim 1, wherein said bracket, lugs and wings are formed of a material from the group consisting of copper, brass, nickel alloys, nickel and bronze.

6. Connecting strap according to claim 1, wherein at least said wings and said soldering lugs have a side to be soldered, and including a solder coating disposed on said sides.

7. Connecting strap according to claim 1, including a solderable layer, coating at least said wings and said soldering lugs.

8. Connecting strap according to claim 7, wherein said solderable layer is in the form of a chemically applied nickel layer.

9. Connecting strap according to claim 7, wherein said solderable layer is in the form of an electrically applied nickel layer.

10. Connecting strap for electrically connecting a contact of a semiconductor component to a conductor run, comprising a bracket having two ends, a first bend at each of said ends, a first portion adjacent each of said first bends, a second bend adjacent each of said first portions, and a second portion adjacent each of said second bends, one of said first portions being longer than the other, soldering lugs integral with said second portions of said bracket, and lateral wings integral with and protruding outwardly from said longer first portion of said bracket, said wings being spaced from the conductor run for positioning the connecting strap for connection to a conductor run.

* * * * *